(12) United States Patent
Haji et al.

(10) Patent No.: US 6,852,572 B2
(45) Date of Patent: Feb. 8, 2005

(54) METHOD OF MANUFACTURING SEMICONDUCTOR DEVICE

(75) Inventors: Hiroshi Haji, Fukuoka (JP); Shoji Sakemi, Fukuoka (JP); Mitsuru Ozono, Fukuoka (JP); Tadahiko Sakai, Fukuoka (JP); Kiyoshi Arita, Fukuoka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 361 days.

(21) Appl. No.: 09/781,563

(22) Filed: Feb. 13, 2001

(65) Prior Publication Data

US 2001/0018233 A1 Aug. 30, 2001

(30) Foreign Application Priority Data

Feb. 14, 2000 (JP) .................................. 2000-034707

(51) Int. Cl.⁷ .............................................. H01L 21/56
(52) U.S. Cl. ....................................... 438/114; 438/127
(58) Field of Search ............................... 438/113, 114, 438/127, FOR 379, FOR 369, FOR 386, FOR 387

(56) References Cited

U.S. PATENT DOCUMENTS

| | | | | |
|---|---|---|---|---|
| 5,668,033 A | * | 9/1997 | Ohara et al. ............... | 438/113 |
| 5,863,813 A | * | 1/1999 | Dando ....................... | 438/114 |
| 5,882,956 A | * | 3/1999 | Umehara et al. ........... | 438/114 |
| 6,107,164 A | * | 8/2000 | Ohuchi ...................... | 438/465 |
| 6,291,317 B1 | * | 9/2001 | Salatino et al. ............ | 438/462 |
| 6,333,469 B1 | * | 12/2001 | Inoue et al. ................ | 174/260 |
| 6,403,449 B1 | * | 6/2002 | Ball ........................... | 438/460 |
| 2002/0014693 A1 | * | 2/2002 | Pollock ...................... | 257/724 |
| 2003/0013233 A1 | * | 1/2003 | Shibata ...................... | 438/114 |

FOREIGN PATENT DOCUMENTS

JP 9-219421 8/1997

* cited by examiner

*Primary Examiner*—George Fourson

(57) ABSTRACT

The method of manufacturing a semiconductor device of the present invention comprises: forming a resin layer on a surface of a semiconductor wafer on which a plurality of semiconductor elements are formed, forming through-holes on the resin layer, a first cutting of either the semiconductor wafer or the resin layer, mounting conductive balls on the through-hole, connecting the conductive ball to electrodes of the semiconductor element, and a second cutting for dividing the wafer into each piece of semiconductor devices. With the processes of the present invention, conductive balls can be easily and effectively mounted on a wafer under optimum conditions, without failure such as slipping or falling down from the required position. This fact contributes to an increased efficiency and a good productivity in the production of semiconductor devices.

22 Claims, 6 Drawing Sheets

(a)

(b)

(c)

(d)

(e)

(f)

METHOD OF MANUFACTURING SEMICONDUCTOR DEVICE

FIELD OF THE INVENTION

The present invention relates to a method of manufacturing a semiconductor device and, more particularly, relates to an effective method for forming metallic bumps on electrodes for external connections of a semiconductor element.

BACKGROUND OF THE INVENTION

In a semiconductor device mounted on a circuit board for electronic equipment, its manufacturing method conventionally followed through the procedures:

i) circuit pattern forming on a semiconductor wafer and dividing it into each element, ii) connecting lead frame pins or metallic bumps to electrodes for external connection of a element and, iii) packaging the entire element including the connected parts with molding resin.

In recent years, however, the method, in which packaging with the molding resin is performed before cutting the wafer, has been popular. According to the method, a resin layer is formed on a surface of a wafer to make a two-layer structure of the wafer and the resin layer. After that, electrodes for external connection including metallic bumps are formed on the structure. For forming metallic bumps, the method in which a conductive ball is mounted on the resin layer is generally employed.

In the two-layer structure having the resin layer over the wafer, there is a big difference in thermal expansion between silicon, which is the main material of the wafer, and the resin material. The structure often causes distortion due to thermal deformation through the addition of heat to the structure. Because of the distortion, a clearance appears partially between the surface of the resin layer and the bottom of a conductive ball held by a carrying head in the step of mounting the conductive ball onto the resin layer. It has therefore been difficult to appropriately mount conductive balls onto the clearance-developed area. That is, the clearance causes conductive balls to slip or fallout from the right proper position to be mounted, when conductive balls are set onto the surface of the resin layer and released from the carrying head sucking them by vacuum.

The object of the present invention is to provide a manufacturing method of a semiconductor device by protecting a semiconductor wafer from deformation, whereby conductive balls are properly mounted on the wafer.

SUMMARY OF THE INVENTION

The method of manufacturing a semiconductor device of the present invention comprises the following steps:

1) forming a resin layer over the surface of a semiconductor wafer having a plurality of semiconductor elements thereon;

2) forming through-holes in the resin layer;

3) a first cutting process for cutting either the wafer or the resin layer over the surface of the wafer;

4) forming metallic bumps to have electrical conduction with electrodes for external connection of the semiconductor element in such a way that conductive balls are mounted on the surface of the first cutting-processed resin layer; and 5) a second cutting process where the metallic bump-formed wafer is divided into each semiconductor chip.

The semiconductor device of the present invention is manufactured through the process steps described above.

With the steps of the present invention, no distortion due to thermal deformation occurs in a semiconductor wafer when a conductive ball is mounted on the wafer to form metallic bumps. This allows the conductive ball to be properly mounted on the distortion-free wafer.

DESCRIPTION OF THE PREFERRED EMBODIMENTS

The preferred embodiments of the present invention are described hereinafter with reference to the accompanying drawings.

First Preferred Embodiment

Figure 1:
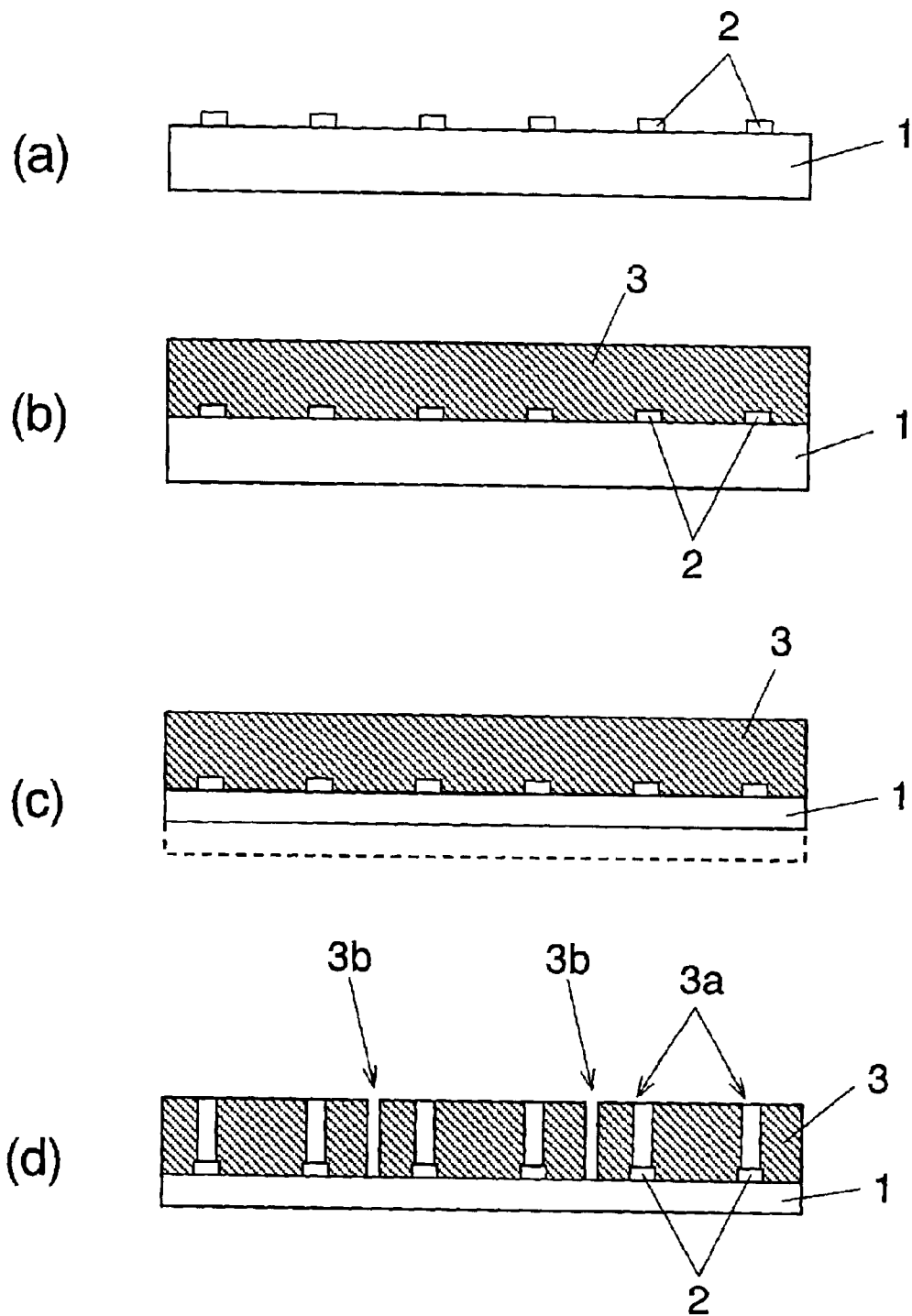
FIG. 1 illustrates process steps of manufacturing a semiconductor device in a first preferred embodiment of the present invention.
Figure 2:
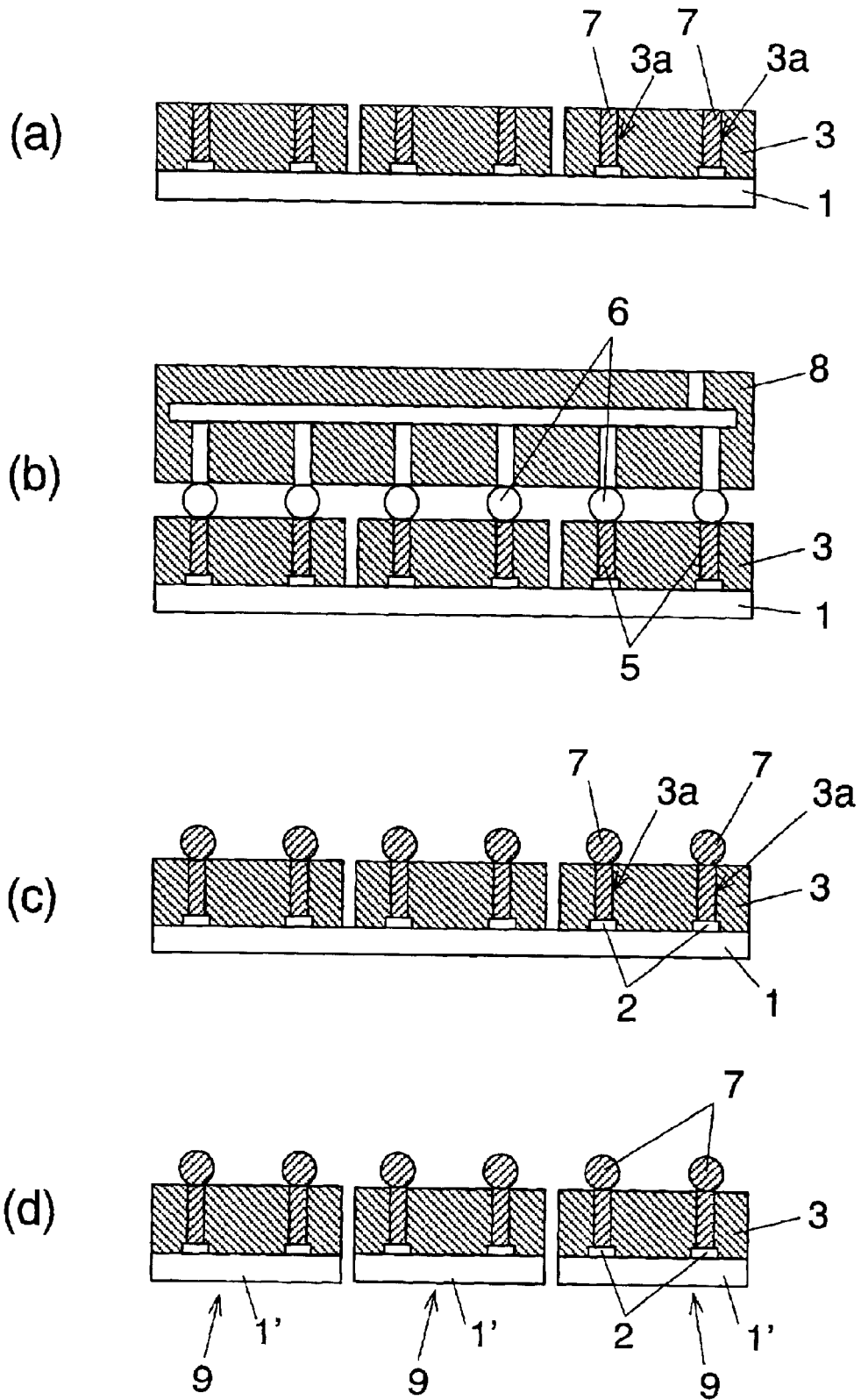
FIG. 2 illustrates process steps of manufacturing a semiconductor device in the first preferred embodiment of the present invention.

FIGS. 1 and 2 illustrate the process steps of manufacturing the semiconductor device of the first preferred embodiment. Four steps, from (a) through (d), in FIGS. 1 and 2 respectively show the method of manufacturing the semiconductor device, following the processing order. In step (a) of FIG. 1, on the top surface of wafer 1 having a plurality of semiconductor elements thereon, electrodes 2 are formed for external connection. In the next step (b), resin layer 3 is formed over the electrodes-formed surface of wafer 1. In the present embodiment, resin materials such as epoxy resins or polyimide resins are employed. Processed into a sheet about 200 μm in thickness, the resin material is adhered onto the top surface of wafer 1, using an adhesive. Although a sheet of resin is employed for forming resin layer 3 in the embodiment, liquid type resin may be uniformly applied over the electrodes-formed surface.

Resin layer 3 not only protects the surface of wafer 1 from damage during a production process, but also works as a sealing resin even after each semiconductor chip 1' is cut out from wafer 1. For the reason, the material for resin layer 3 has to have sealing characteristics for protecting semiconductor chip 1'. That is, the material to be selected has to satisfactorily serve as a sealing material, having required properties such as moisture resistance, migration resistance, high strength against external forces, and electrical insulation characteristics. Materials conventionally employed for manufacturing a semiconductor device meet these conditions. It is also effective to use the resin including fillers such as silica or alumina, for ensuring high reliability after a semiconductor device is mounted on a circuit board.

Semiconductor wafer 1, on which resin layer 3 is formed, is now carried to the thinning process where its back surface is ground. As shown in step (c) of FIG. 1, the back surface, which is opposite to the surface having resin layer 3 thereon, is ground. The thickness of wafer 1, before the grinding, is indicated by the broken line in FIG. (c), is ground down to the thickness indicated by the solid line. As wafer 1 loses its thickness, a mechanical stress is applied to it in the grinding step. However, reinforcement by resin layer 3 allows wafer 1 to be free from damaging.

The next step is forming through-holes in resin layer 3. By irradiating a laser to the spot corresponding to electrodes 2 on resin layer 3, through-holes 3a are formed in resin layer 3 so as to reach the surface of electrode 2, as shown in (d) of FIG. 1.

According to the present embodiment, in addition to through-hole forming, laser cutting is also processed in step (d). In the cutting process, only resin layer 3 is divided into each piece, cut along the dividing line for each element with laser. That is, the through-hole forming step combines with the first cutting step for cutting only resin layer 3 to divide it into each piece. This eliminates the need for the extra step for cutting the resin layer, allowing resin layer 3 to be cut without damage to wafer 1.

Referring to FIG. 2, now will be described the process of forming a metallic bump, at through-holes 3a, to have electrical connection with electrode 2. As shown in (a) of FIG. 2, solder cream 5 is filled into through-hole 3a with a spatula such as a squeezee. After that, solder ball 6 is mounted on solder cream 5 filled into through-holes 3a in resin layer 3, using suction head 8 as shown in (b) of FIG. 2. Solder ball 6, whose composition is the same as that of solder cream 5, serves as a conductive ball described in the explanation above.

In a conventional process, there had been a distortion problem due to thermal deformation in the two-layered structure of wafer 1 and non-divided resin layer 3. However, according to the present embodiment, prior to the process of mounting solder ball 6, resin layer 3 is divided at the lines corresponding to each piece, which protects resin layer 3 from occurring distortion due to thermal deformation. With such a structure, resin layer 3 maintains top surface which is leveled, which ensures suction head 8 to provide an appropriate mounting condition when solder ball 6 is mounted thereon. This fact allows solder ball 6 to sit properly without variations such as slipping or moving from the required position.

Next, wafer 1 is brought to the reflow process to be heated. By the application of heat, solder ball 6 and solder particles contained in solder cream 5 melt and thereby ball 6 is soldered with the top surface of electrode 2. Through this process, metallic bump 7 is formed, and coupled reaching to electrode 2 for electrical connection via through-holes in resin layer 3, as shown in (c) of FIG. 2.

Wafer 1 with metallic bumps 7 thereon, through the processes above, is now ready to be cut. Wafer 1 is cut along the divided position of resin layer 3, completely separated into each chip 1'. As shown in (d) of FIG. 2, semiconductor device 9 is thus completed, having resin layer 3 over the electrodes-formed surface of chip 1', and also having metallic bumps 7 having, through resin layer 3, electric connection with electrode 2.

Second Preferred Embodiment

Figure 3:
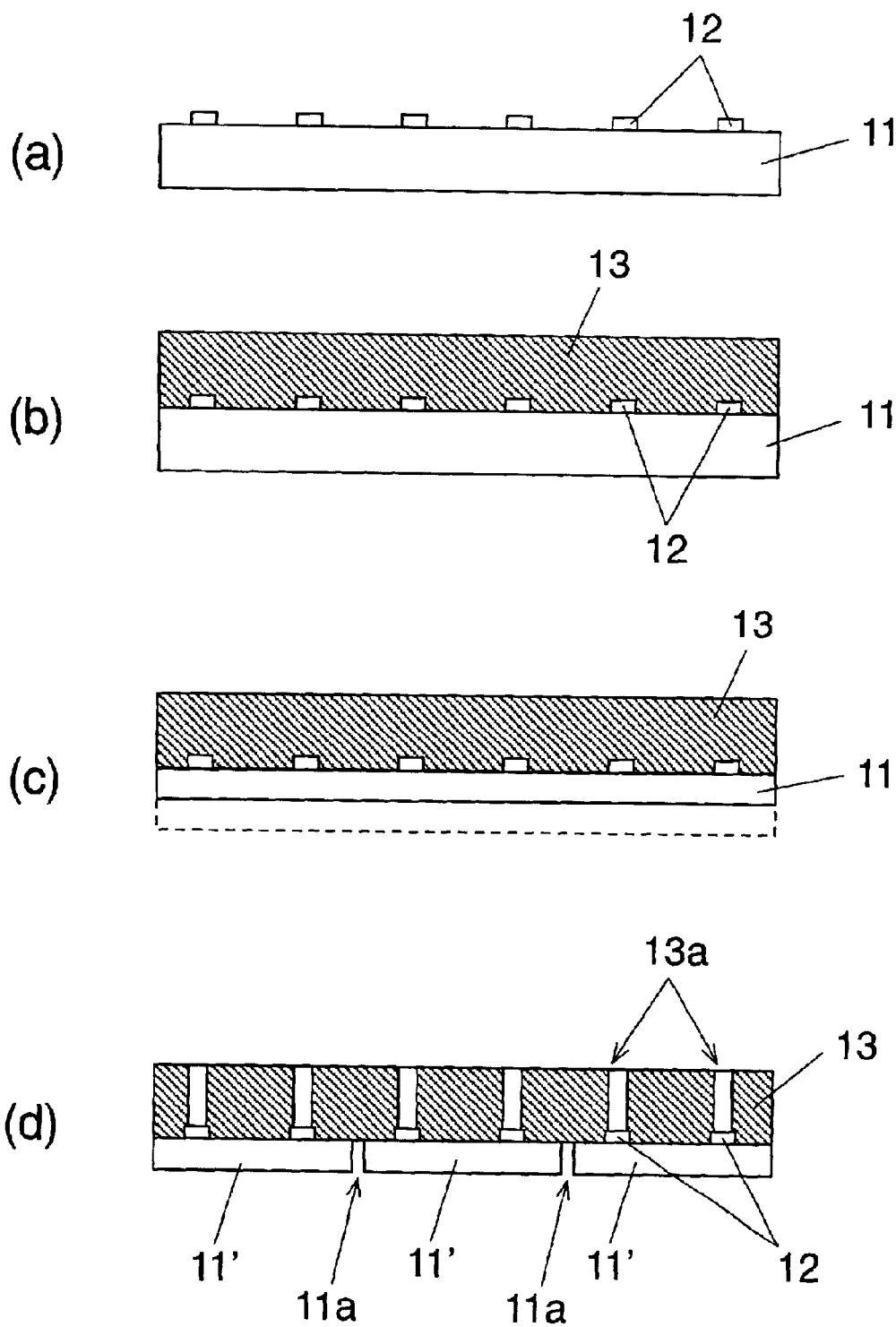
FIG. 3 illustrates process steps of manufacturing a semiconductor device in a second preferred embodiment of the present invention.
Figure 4:
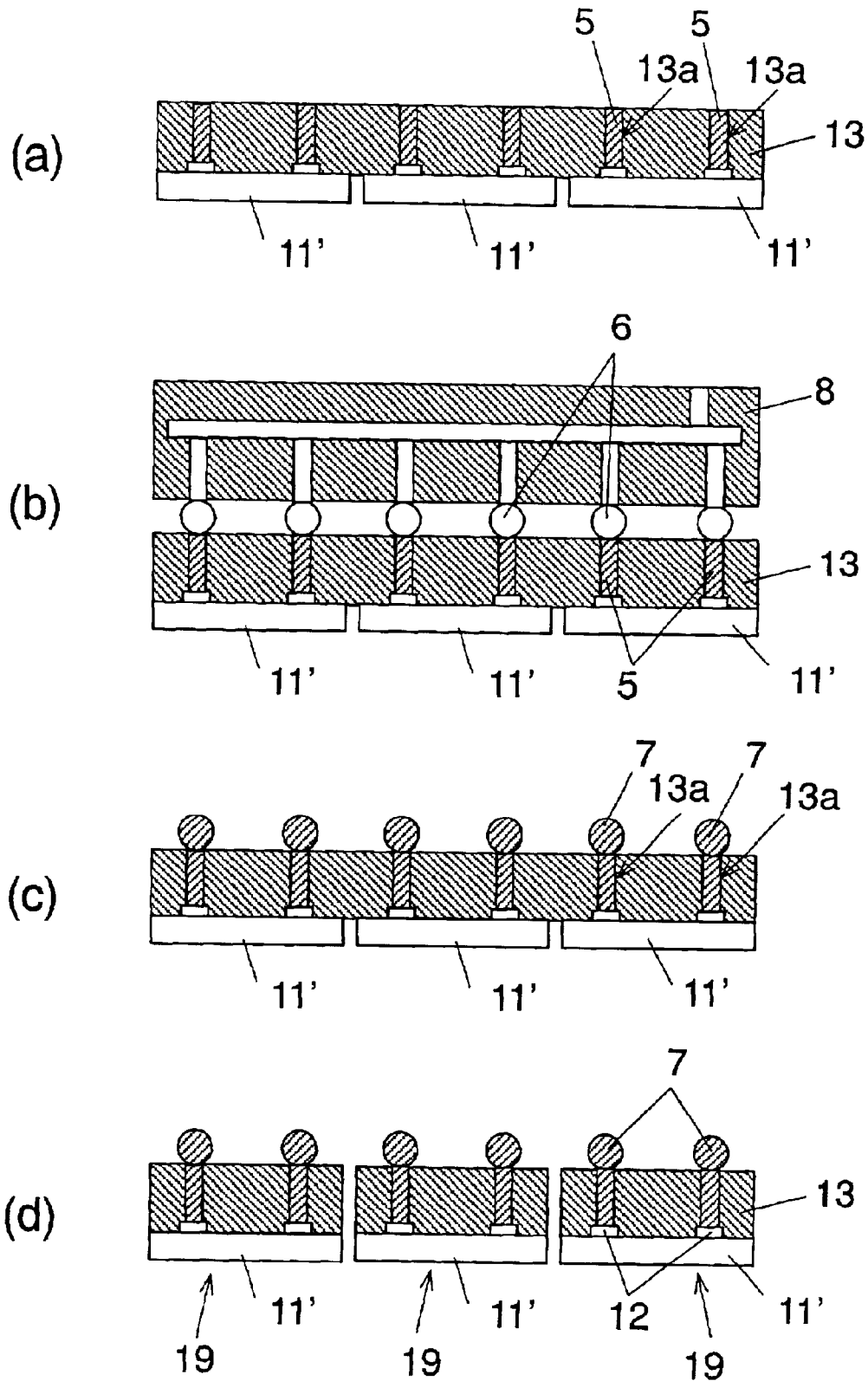
FIG. 4 illustrates process steps of manufacturing a semiconductor device in the second preferred embodiment of the present invention.

FIGS. 3 and 4 illustrate the process steps of manufacturing the semiconductor device of the second preferred embodiment. Four steps, from (a) through (d), in FIGS. 3 and 4 respectively show the method for manufacturing the semiconductor device, following the processing order. In the first cutting process of the present embodiment, where two layer structure comprising semiconductor wafer and resin layer is cut, only the wafer is cut, while in the corresponding process of the first preferred embodiment, only the resin layer is cut.

In step (a) of FIG. 3, on the top surface of wafer 11 having a plurality of semiconductor elements thereon, electrodes 12 are formed for external connection. The next two steps, i.e., resin layer-forming step and wafer 11 grinding step are the same as those shown in (b) and (c) steps of FIG. 1 in the first preferred embodiment.

After subjected to steps (b) and (c), wafer 11 is now ready for the through-holes forming and cutting. Like the corresponding step in the first preferred embodiment, the through-holes forming step described here employs laser-machining, providing resin layer 13 with through-holes 13a. As shown in (d) of FIG. 3, through-holes 13a reach through resin layer 13 to the surface of electrode 12. At the same time, the step contains the cutting process: grooves 11a are formed along the dividing line for each element on wafer 11, then wafer 11 is divided into each semiconductor chip 11'. This step combines the through-hole forming process with the first cutting process where only wafer 11 is divided by cutting.

The metallic bump-forming process comes next, where metallic bumps are formed at through-holes 13a to make electrical contact to electrodes 12. Like the corresponding steps in the first preferred embodiment, solder cream 5 is filled into through-holes 13a as shown in (a) of FIG. 4, then solder balls 6 are mounted on through-holes 13a as shown in (b) of FIG. 4. Prior to the step of mounting solder ball 6, wafer 11 is divided at the position separating each element, which prevents resin layer from having distortion due to thermal deformation. This fact ensures solder balls 6 to sit properly without failure such as slipping or falling down from the required position, as in the case of the first preferred embodiment.

After processing in step (b), wafer 11 with chips 11' still connected together by resin layer 3, is brought to the reflow step to be heated, as in the case of the first preferred embodiment. By the application of heat, metallic bump 7 is formed on resin layer 13, reaching through layer 13 to electrodes 12 for electrical connection, as shown in (c) of FIG. 4.

Wafer 11 with metallic bump 7 thereon, i.e., a series of chips 11', is now ready to be cut. Resin layer 13 is cut along the dividing line for each chip 11', completely divided into an individual piece. As shown in (d) of FIG. 4, semiconductor device 19 is thus completed, having resin layer 13 over the electrodes-formed surface of semiconductor chip 11', and also having metallic bumps 7 coupled through resin layer 13 to electrodes 12 for electrical connection.

Third Preferred Embodiment

Figure 5:
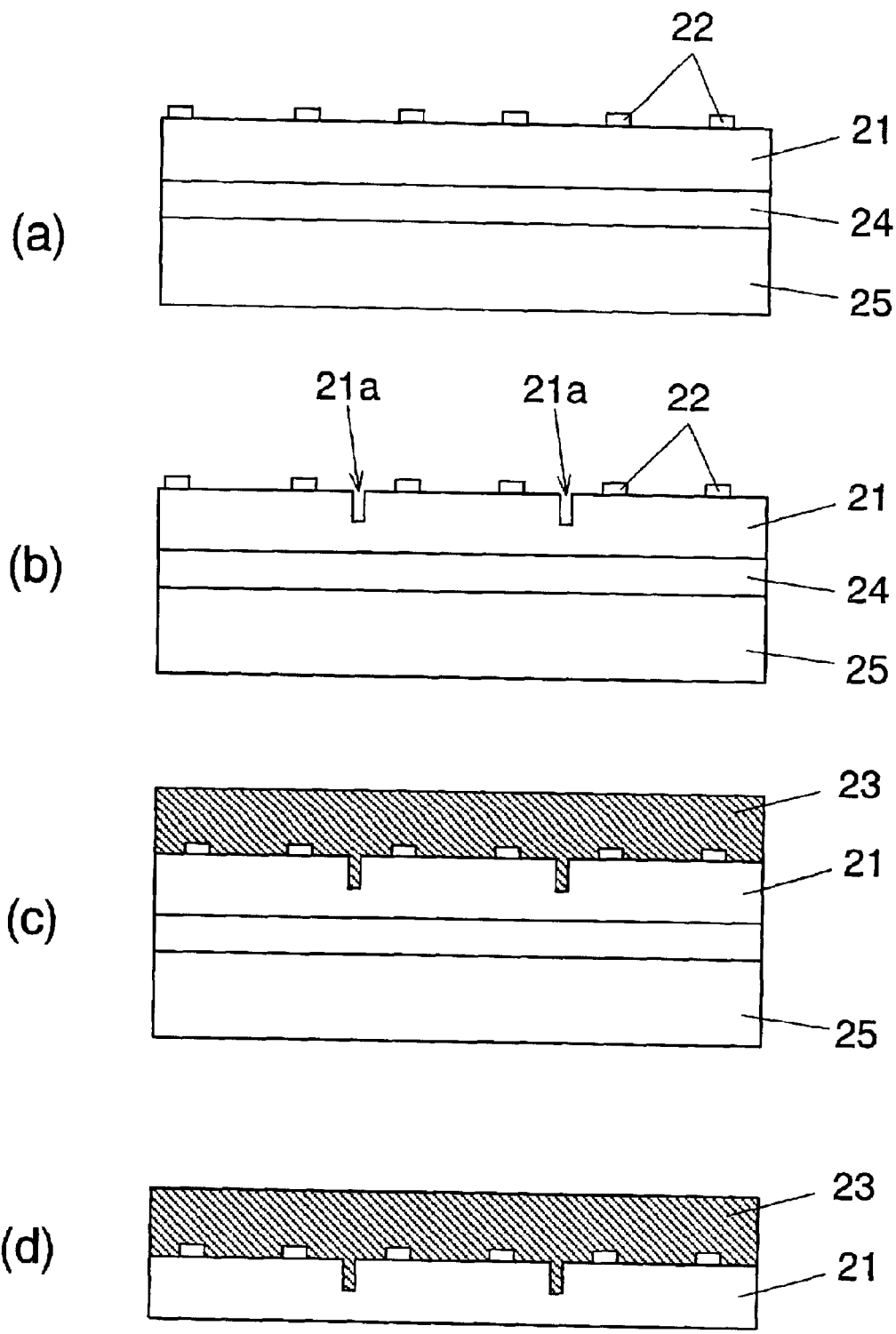
FIG. 5 illustrates process steps of manufacturing a semiconductor device in a third preferred embodiment of the present invention.
Figure 6:
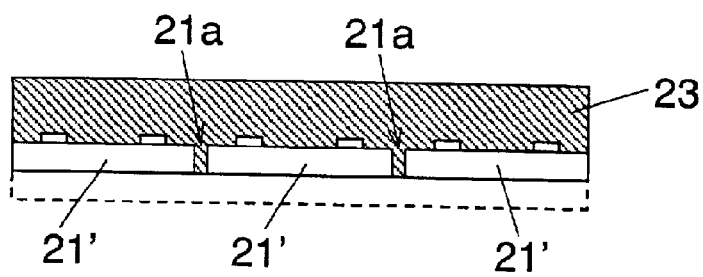
FIG. 6 illustrates process steps of manufacturing a semiconductor device in the third preferred embodiment of the present invention.
Figure 6:
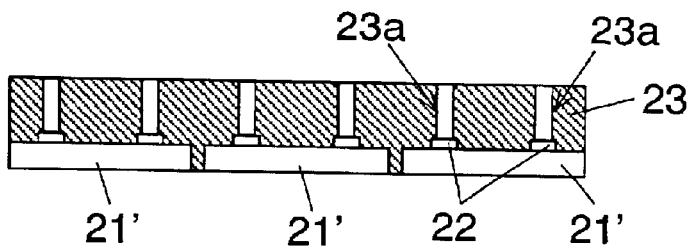
Figure 6:
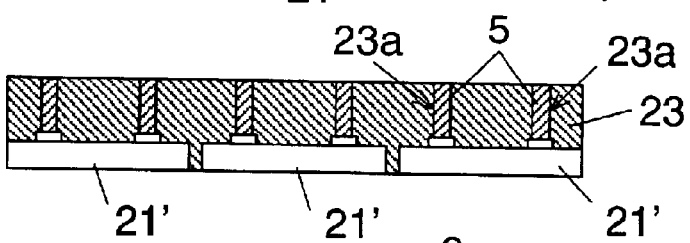
Figure 6:
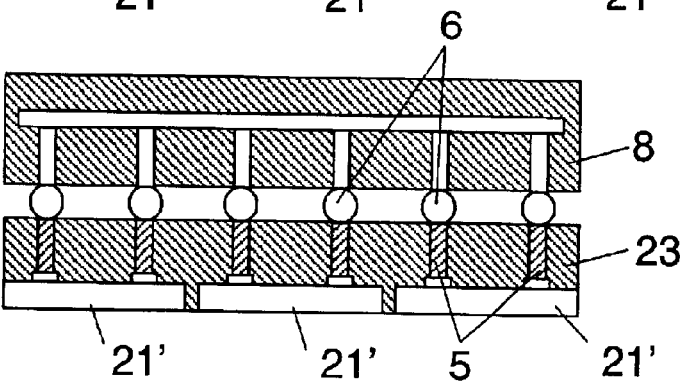
Figure 6:
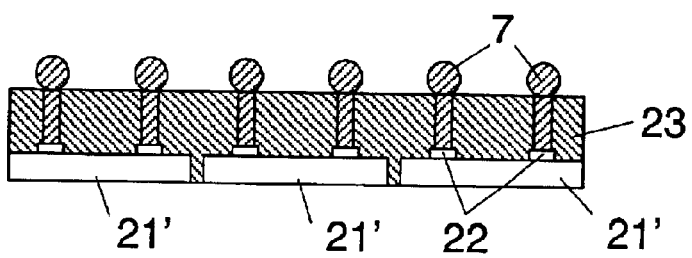
Figure 6:
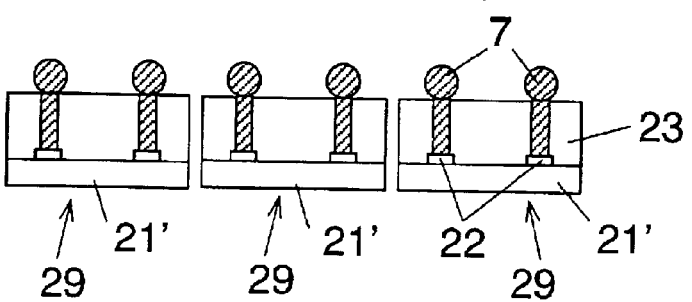

FIGS. 5 and 6 illustrate the process steps of manufacturing the semiconductor device of the third preferred embodiment. Four steps, from (a) through (d), in FIGS. 5 and 6 respectively show the method for manufacturing the semiconductor device, following the processing order. According to the present embodiment, prior to the resin layer-forming step, grooves are formed on the top surface of the wafer. After the resin layer is formed, only the wafer is divided by grinding the back surface of the wafer.

In step (a) of FIG. 5, electrodes 22 for external connection are formed on the top surface of semiconductor wafer 21. On the bottom surface of wafer 21, resin-made protective sheet 25 is applied therein to via pressure sensitive adhesive layer 24. Protective sheet 25 works as a reinforcing material for wafer 21 in the groove-forming step described below.

Wafer 21 reinforced by protective sheet 25 is brought to the groove-forming process. In the process, as shown in (b) of FIG. 5, grooves 21a are formed on the top surface of wafer 21 along the dividing line for each piece, over which resin layer 23 is formed, as shown in (c) of FIG. 5. The resin layer-forming process is performed in the same manner as the step described in the first preferred embodiment. In the present embodiment, it is preferable to use liquid resin to form resin layer 23.

Following to step (c), as shown in (d) of FIG. 5, after removal of protective sheet 25 from the bottom surface, wafer 21 is brought to the thinning process. As in the same way in the first preferred embodiment, the rear surface of wafer 21 is removed by grinding. By grinding until the groove that has been formed in step (b) of FIG. 5 appears on the back surface, wafer 21 is divided along grooves 21a into each semiconductor chip 21'. In the present embodiment, only wafer 21 is divided through the groove-forming and the grinding processes. In other words, these two processes make up the first cutting process.

Next, through-holes are formed in wafer 21 by laser machining in the same way as in the first preferred embodiment. The metallic bump-forming process comes next, where metallic bumps are formed at through-holes 23a to have electrical connection with electrodes 22. Like the corresponding steps in the first and second preferred embodiments, solder cream 5 is filled into through-hole 23a as is shown in (c) of FIG. 6, then solder ball 6 is mounted on through-holes 23a as is shown in (d) of FIG. 6. Prior to the solder-ball mounting process, wafer 21 is divided into individual pieces corresponding to semiconductor elements, which prevents resin layer from having distortion due to thermal deformation. This fact ensures solder ball 6 to sit properly without failures such as slipping or falling down from the required position, as in the cases of the previous two embodiments.

After processed in step (d), wafer 21 with semiconductor chips 21' still connected together by resin layer 23, is brought to the reflow process to be heated, as in the cases of the previous two embodiments. By the application of heat, metallic bumps 7 are formed on resin layer 23, reaching through layer 23 to electrodes 22 for electrical connection, as shown in (e) of FIG. 6.

Wafer 21 with metallic bumps 7 thereon, i.e., a series of semiconductor chips 21', is now ready to be cut. Resin layer 23 is cut along the dividing line for each chip 21', completely divided into an individual piece. As shown in (f) of FIG. 6, semiconductor device 29 is thus completed, having resin layer 23 over the electrodes-formed surface of chip 21', and also having metallic bumps 7 reached through resin layer 23 to electrodes 22 for electrical connection.

In the method of manufacturing a semiconductor device, wherein a resin layer is formed over the top surface of a semiconductor wafer, and then a metallic bump is formed so as to have electrical connection, through the resin layer, with a semiconductor element, the following is novel in the embodiments of the present invention: the first cutting process, where either the wafer or the resin layer is cut, is performed prior to the conductive ball mounting process for forming the metallic bump. This makes possible not only to efficiently mount conductive balls on a plurality of elements on the wafer, but also to prevent the two-layered structure, which is made of the wafer and the resin layer, from a distortion due to thermal deformation.

As no distortion occurs, when mounting the conductive balls, the layered structure is kept in a good condition. No clearance appears between the resin layer and the conductive balls to be mounted thereon, thereby ensuring the balls sit properly without failures such as slipping or falling down from the required position. In this way, with the manufacturing method of the present invention, conductive balls can be easily and effectively mounted on the wafer under optimum conditions, which contributes to an increased efficiency and good productivity in manufacturing semiconductor devices. Furthermore, combining the cutting processes, where either of a resin layer or a wafer is cut, with other process promises reduced processing costs.

What is claimed is:

1. A method of manufacturing a semiconductor device comprising the steps of:
   (a) forming a resin layer over a surface of a semiconductor wafer on which a plurality of semiconductor elements are formed;
   (b) forming a through-hole on the resin layer;
   (c) first cutting where one of the wafer and the resin layer is cut;
   (d) mounting a conductive ball on the through-hole, and connecting the conductive ball with an electrode of the semiconductor element; and
   (e) second cutting where the wafer is divided into each piece of a semiconductor device.

2. The method of manufacturing the semiconductor device of claim 1 wherein the through-hole is formed by laser irradiation.

3. The method of manufacturing the semiconductor device of claim 1 wherein the first cutting of the resin layer and the through-hole forming are performed by laser irradiation.

4. The method of manufacturing the semiconductor device of claim 3 wherein the first cutting of the resin layer and forming the through-hole are processed in one process step.

5. The method of manufacturing the semiconductor device of claim 1 wherein the conductive ball and the electrode of the semiconductor element is connected by soldering.

6. The method of manufacturing the semiconductor device of claim 1 wherein the conductive ball is a solder ball.

7. The method of manufacturing the semiconductor device of claim 1 wherein the first cutting of the semiconductor wafer comprises steps of grinding a wafer surface having no semiconductor elements thereon and forming grooves on the ground surface.

8. The method of manufacturing the semiconductor device of claim 1 wherein the first cutting of the semiconductor wafer comprises steps of forming grooves on a wafer surface on which the semiconductor elements are formed and grinding a wafer surface without the grooves.

9. A method of manufacturing a semiconductor device comprising the steps of:
   forming a resin layer on a semiconductor wafer so as to form a semiconductor structure;
   cutting one of said resin layer and said semiconductor wafer along a dividing line into one of a plurality of resin layers on said semiconductor wafer and a plurality of semiconductor wafers on said resin layer, respectively; and
   forming a through hole in said resin layer and filling said through hole with solder.

10. The method of manufacturing a semiconductor device of claim 9, further comprising the step of mounting a solder ball on said solder.

11. The method of manufacturing a semiconductor device of claim 9, further comprising the step of cutting the other one of said resin layer and said semiconductor wafer along said dividing line so as to form a plurality of semiconductor structures.

12. The method of manufacturing a semiconductor device of claim 9, wherein the step of cutting comprises cutting said resin layer along the dividing line.

13. The method of manufacturing a semiconductor device of claim 9, wherein the step of cutting comprises cutting said semiconductor wafer along the dividing line.

14. The method of manufacturing a semiconductor device of claim 9, wherein the step of cutting comprises the step of forming a groove in said semiconductor wafer on one side thereof before the step of forming a resin layer.

15. The method of manufacturing a semiconductor device of claim 14, wherein the step of forming a resin layer includes filling said groove with a portion of said resin layer.

16. The method of manufacturing a semiconductor device of claim 15, wherein the step of cutting further comprises grinding said semiconductor wafer on a side opposing said one side so as to reach said groove.

17. The method of manufacturing a semiconductor device of claim 14, wherein the step of cutting further comprises grinding said semiconductor wafer on a side opposing said one side so as to reach said groove.

18. The method of manufacturing a semiconductor device of claim 17, further comprising the steps of forming a through hole in said resin layer and filling said through hole with solder.

19. The method of manufacturing a semiconductor device of claim 18, further comprising the step of mounting a solder ball on said solder.

20. The method of manufacturing a semiconductor device of claim 17, further comprising the step of cutting the other one of said resin layer and said semiconductor wafer along said dividing line so as to form a plurality of semiconductor structures.

21. The method of manufacturing a semiconductor device of claim 10, further comprising the step of cutting the other one of said resin layer and said semiconductor wafer along said dividing line so as to form a plurality of semiconductor structures.

22. The method of manufacturing a semiconductor device of claim 10, wherein the step of mounting a solder ball on said solder is performed after the step of cutting.

* * * * *